(12) United States Patent
Kim et al.

(10) Patent No.: US 7,125,774 B2
(45) Date of Patent: Oct. 24, 2006

(54) METHOD OF MANUFACTURING TRANSISTOR HAVING RECESSED CHANNEL

(75) Inventors: Min Kim, Seoul (KR); Ju-Bum Lee, Gyeonggi-do (KR); Hyeon-Deok Lee, Seoul (KR); Seung-Jae Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 113 days.

(21) Appl. No.: 10/937,532

(22) Filed: Sep. 8, 2004

(65) Prior Publication Data
US 2005/0054163 A1 Mar. 10, 2005

(30) Foreign Application Priority Data
Sep. 9, 2003 (KR) .................. 10-2003-0063359

(51) Int. Cl.
*H01L 21/336* (2006.01)
*H01L 21/76* (2006.01)
*H01L 21/3205* (2006.01)

(52) U.S. Cl. .................. 438/270; 438/430; 438/589; 257/E21.429

(58) Field of Classification Search ................. 438/268, 438/270, 589, 430; 257/E21.429
See application file for complete search history.

(56) References Cited

U.S. PATENT DOCUMENTS 5,998,835 A * 12/1999 Furukawa et al. .......... 257/330
6,238,967 B1 * 5/2001 Shiho et al. ................ 438/244
6,368,911 B1 * 4/2002 Fu ............................. 438/248
6,448,139 B1 * 9/2002 Ito et al. .................... 438/270
6,828,210 B1 * 12/2004 Kim et al. .................. 438/424

FOREIGN PATENT DOCUMENTS

| KR | 2002-2298 | 1/2002 |
| KR | 2002-0032934 | 5/2002 |
| KR | 10-0346617 | 7/2002 |

OTHER PUBLICATIONS

English Language of Abstract of Korean Patent Publication No. 2002-0032934.
English Language of Abstract of Korean Patent Publication No. 10-0346617.
English language abstract of Korean Application No. 2002-2298.

* cited by examiner

*Primary Examiner*—Michael Lebentritt
*Assistant Examiner*—Ron Pompey
(74) *Attorney, Agent, or Firm*—Marger Johnson & McCollom, P.C.

(57) ABSTRACT

A method of fabricating a transistor with a recessed channel is provided. The method includes forming trenches for a recessed channel on a semiconductor substrate, depositing an isolation layer on the semiconductor substrate on which the trenches are formed, depositing a gate dielectric layer on the semiconductor substrate so that the gate dielectric layer can be extended to bottoms and sidewalls of the trenches, forming gates to fill the trenches, and forming source and drain regions in the semiconductor substrate adjacent to the gates.

18 Claims, 16 Drawing Sheets

METHOD OF MANUFACTURING TRANSISTOR HAVING RECESSED CHANNEL

CROSS REFERENCE TO RELATED APPLICATIONS

This application claims priority from Korean Patent Application No. 2003-63359, filed on Sep. 9, 2003, in the Korean Intellectual Property Office, the disclosure of which is incorporated by reference in its entirety for all purposes.

BACKGROUND OF THE INVENTION

1. Field of the Invention

This disclosure relates to a method of fabricating a semiconductor device, and particularly to, a method of fabricating a transistor with a recessed channel.

2. Description of the Related Art

As integrated circuit semiconductor devices become more integrated and design rules decrease dramatically, it becomes increasingly difficult to stably operate a transistor. For instance, a reduction in the design rule reduces a gate width, thus reducing a short length of the transistor. As a result, short channel effects frequently occur.

The short channel effect causes a punch through between source and drain regions of the transistor. Punch-through is considered a major factor that causes malfunctioning of the transistor. To solve problems caused by the short channel effect, much research on methods of increasing a channel length regardless of a reduction in the design rule has been conducted. For instance, an MOS transistor with a recessed channel, which is obtained by recessing portions of a semiconductor substrate below gates, is designed to increase a channel length with respect to a limited gate dimension.

FIGS. 1A and 1B are schematic cross-sectional views for explaining problems with fabricating a conventional transistor with a recessed channel. Referring to FIG. 1A, a recessed channel is obtained by forming a first trench 2 in a semiconductor substrate 1 and forming a gate 3 to fill the first trench 2. The recessed channel is formed along the profile of the first trench 2, that is, at the bottom and sidewalls thereof. Thus, the length of the recessed channel is longer than a critical dimension of the gate 3.

However, as illustrated in FIG. 1B, during manufacture of the transistor with such a recessed channel, a residual material 7, e.g., silicon (Si), from the semiconductor substrate 1 may remain between an isolation layer 5 and the gate 3 filling the first trench 2. The isolation layer 5 is obtained in an isolation process preceding the manufacture of the transistor.

When the material 7, e.g., a silicon residual substance, is interposed between the gate 3 and the isolation layer 5, a leakage current is prone to occur where the silicon residual substance 7 is formed. Further, the silicon residual substance 7 may cause short circuiting between source/drain regions or a change in a threshold voltage Vth.

The occurrence of the silicon residual substance 7 is caused by an inclination of the sidewalls of a second trench 6 with respect to the isolation layer 5. That is, the sidewall profile of the second trench 6 is not perpendicular to and is inclined at an angle with respect to the isolation layer 5. Thus, a width d1 of an upper portion of an active area defined by the isolation layer 5 is narrower than a width d2 between bottom corners of the second trench 6.

The inclination of the sidewall profile of the second trench 6 with respect to the isolation layer 5 inevitably causes the generation of the silicon residual substance 7 between sidewalls of the first trench 2 and the second trench 6, i.e., at an interface between the gate 3 and the isolation layer 5. Also, it is almost impossible to realize the first and second trenches 2 and 6 with perpendicular sidewall profiles using an etching process of forming the first and second trenches 2 and 6. Further, a very tight process margin is needed to fabricate the second trench 6 to include perpendicular sidewalls, and it is difficult to make the isolation layer 5 completely fill the second trench 6.

Accordingly, an additional process of removing the silicon residual substance 7 is required. For instance, the silicon residual substance 7 must be removed using anisotropic etching, e.g. chemical dry etching, on the first trench 2.

However, the additional process leads to an increase in a critical dimension (CD) of the first trench 2 below the gate 3, thus causing nonuniformity in the length of the recessed channel. The increase in the CD of the first trench 2 also deteriorates topology of a polycrystalline silicon layer which is deposited to fill the first trench 2 and form the gate 3. In this case, when forming a conductive layer, such as a tungsten silicide (WSix) layer, on the polycrystalline silicon layer, the tungsten silicide (WSix) layer may break into pieces.

Accordingly, there is a strong need to develop a method of fabricating a transistor with a recessed channel where a material such as the silicon residual substance 7 of FIG. 1B does not remain between the sidewalls of the first trench 2, the recessed channel, and the isolation layer 5.

Embodiments of the invention address these and other disadvantages of the conventional art.

SUMMARY OF THE INVENTION

Embodiments of the invention provide a method of fabricating a transistor with a recessed channel in which a residual substance of a semiconductor substrate does not remain along the sidewalls of trenches for the recessed channel.

BRIEF DESCRIPTION OF THE DRAWINGS

The above and other aspects and advantages of the invention will become more apparent by describing in detail preferred embodiments thereof with reference to the attached drawings.

DETAILED DESCRIPTION OF THE INVENTION

Figure 1A:
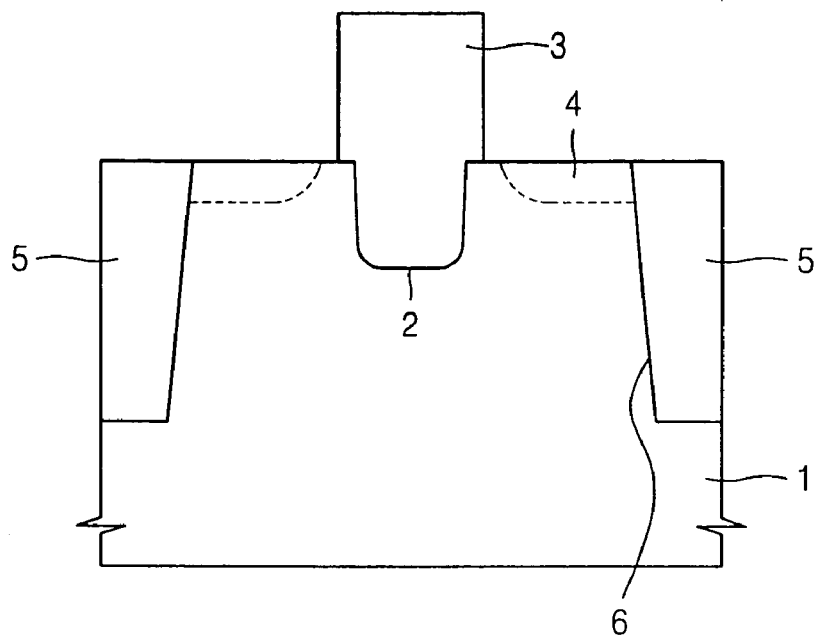
FIGS. 1A and 1B are schematic cross-sectional views illustrating a method of fabricating a conventional transistor with a recessed channel.

Hereinafter, preferred embodiments of the invention will be described with reference to the accompanying drawing (s). The same reference numerals represent the same elements throughout the drawings.

In the preferred embodiments of the invention, first trenches for a recessed channel of a transistor are formed prior to an isolation process where an active region is defined. Thus, gates filling the first trenches directly contact an isolation layer, thus preventing a semiconductor substrate residual substance, such as the silicon residual substance 7 of FIG. 1B, from remaining between the isolation layer and the gate. For this reason, it is possible to form second trenches such that their sidewalls are inclined with respect to the isolation layer, thus effectively preventing the second trenches from being incompletely filled with the isolation layer. In other words, it is possible to increase or improve a process margin for forming the isolation layer.

FIGS. 2 through 13B are diagrams illustrating a method of fabricating a transistor with a recessed channel, according to some embodiments of the invention.

Figure 2:
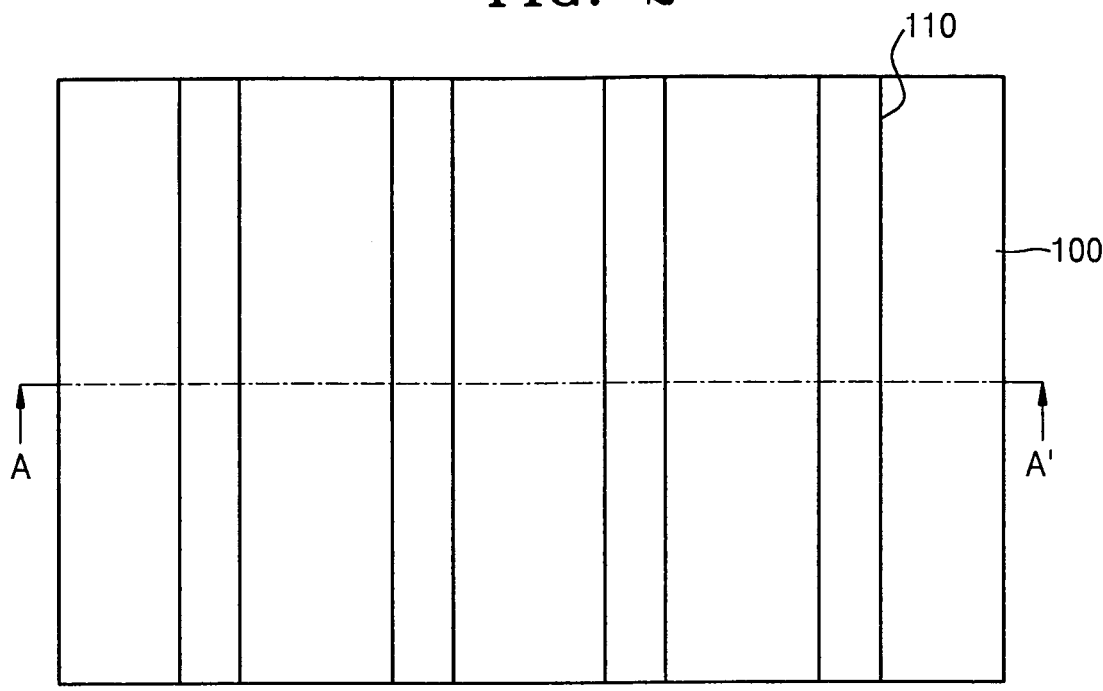
FIGS. 2 through 13B are diagrams illustrating a method of fabricating a transistor with a recessed channel, according to some embodiments of the invention.
Figure 3:
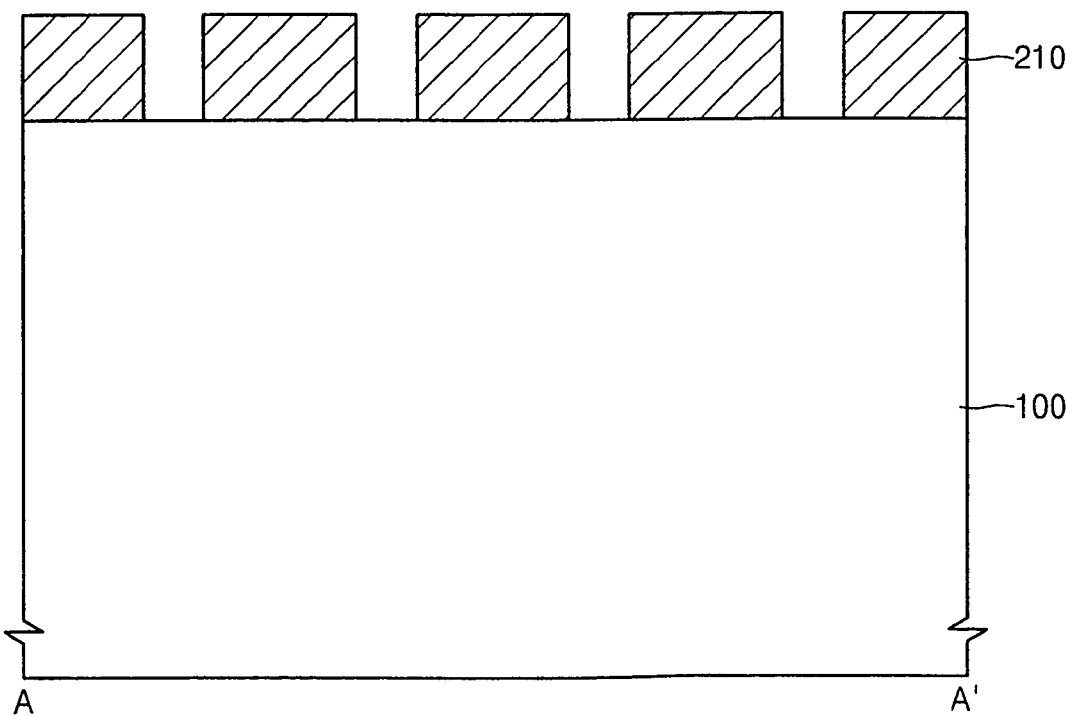
Figure 4:
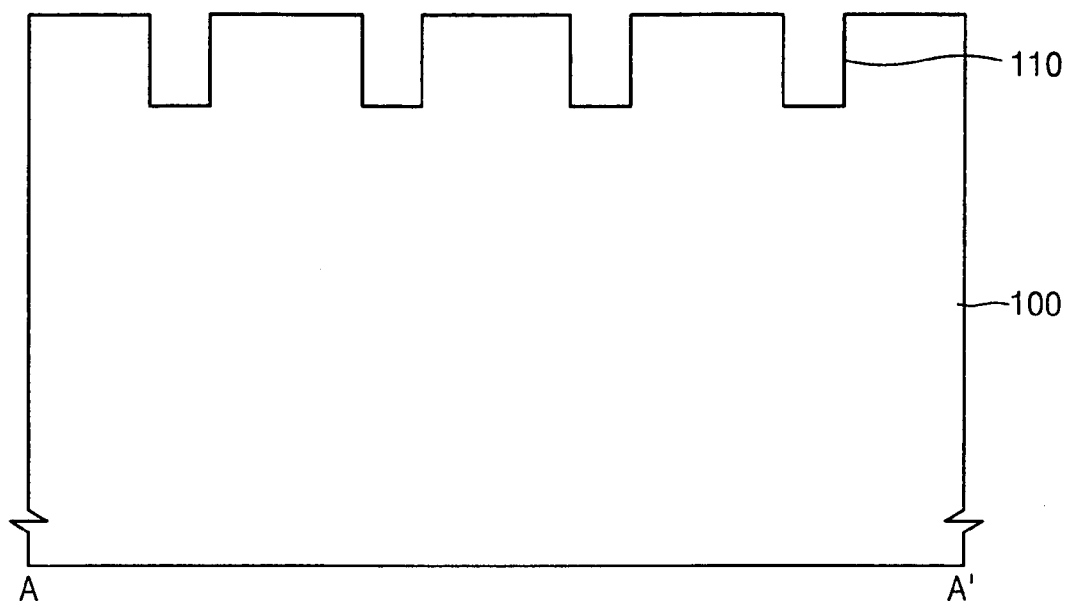
Figure 5:
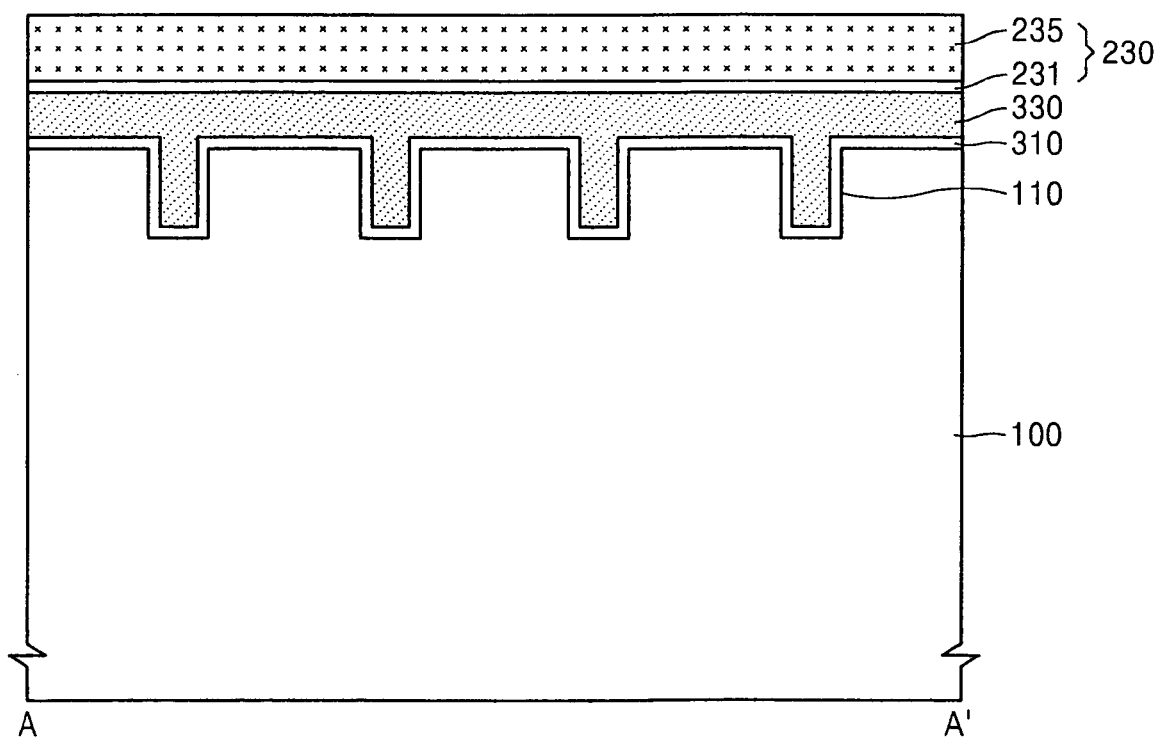

FIG. 2 is a plan view of a semiconductor substrate 100 including first trenches 110 for a recessed channel. FIGS. 3 through 5 are cross-sectional views of the semiconductor substrate 100 of FIG. 2, taken along the line A–A'. Unlike a conventional transistor manufacturing process, the first trenches 110 are formed in the semiconductor substrate 100 prior to an isolation process in which an active area is defined.

FIG. 3 is a schematic cross-sectional view of the semiconductor substrate 100 on which a first etch mask 210 is deposited to form the first trenches 100 for a recessed channel. The first etch mask 210 is formed to expose portions of the semiconductor substrate 100 where transistor gates are to be formed. Since a plurality of transistor gates are to be formed as long parallel lines, a plurality of first trenches 110 are also formed as long parallel lines. A critical dimension (CD) of each first trench 110 may vary according to a design rule of a semiconductor device but it is generally roughly from 50 nm to 100 nm. The first etch mask 210 is deposited to expose the semiconductor substrate 100 within the above CD range of the first trenches.

The first etch mask 210 may be a photoresist pattern. In this case, an anti-reflection layer (not shown) may be deposited as an underlying layer of the semiconductor substrate 100 prior to applying a photoresist layer for the photoresist pattern. The anti-reflection layer may be formed to a thickness of about 600 Å.

The first etch mask 210 may also be used as a hard mask. In this case, the hard mask includes a polycrystalline silicon layer of a thickness of about 1000 Å, and a silicon oxide layer, as a buffer layer, may be deposited to a thickness of about 100 Å between the polycrystalline layer and the semiconductor substrate 100. When the first etch mask 210 is used as the hard mask, the hard mask may be fabricated by forming the anti-reflection layer and the photoresist layer on the polycrystalline silicon layer, exposing and developing these layers to obtain a photoresist pattern, and patterning the polycrystalline layer and the buffer layer using the photoresist pattern as an etch mask.

The first etch mask 210 as the hard mask may be formed of an insulating layer, such as a silicon nitride layer or a silicon oxidized nitride layer, which includes a silicon oxidation or a nitride layer.

FIG. 4 is a schematic cross-sectional view of the semiconductor substrate 100 in which the first trenches 110 are formed by etching portions of the semiconductor substrate 100 using the first etch mask 210 of FIG. 3. More specifically, the first trenches 110 for a recessed channel are formed by selectively etching portions of the semiconductor substrate 100 which are exposed by the first etch mask 210 of FIG. 3. Such selective etching may be performed by anisotropic dry etching such as reactive ion etching (RIE).

Depths of the first trenches 110 may be deeper than those of source/drain regions that are to be formed during a subsequent transistor manufacturing process. For instance, the first trenches 110 may be formed to depths of about 2000 Å or less.

FIG. 5 is a schematic cross-sectional view illustrating forming a stopper 230 on the semiconductor substrate 100 with the first trenches 110. More specifically, as shown in FIG. 4, the first etch mask 210 is selectively removed after forming the first trenches 110. Next, the stopper 230 is formed on the semiconductor substrate 100, and used during a planarization process for the isolation process of defining the active area.

Before forming the stopper 230, a dielectric layer 310 and a first conductive layer 330 may be further deposited as underlying layers. The dielectric layer 310 can also be used as a gate oxide layer in a transistor formed during a subsequent process. For this reason, the dielectric layer 310 is thinly formed to be used as the gate oxide layer. For instance, the dielectric layer 310 may be formed to a thickness of about 200 Å, preferably, to a thickness of 40 Å or less.

As the gate oxide layer, the dielectric layer 310 may be a silicon oxide ($SiO_2$) layer formed using dry thermal oxidation or wet thermal oxidation. If necessary, the dielectric layer 310 may be a hafnium oxide ($HfO_2$) layer or an aluminum oxide ($Al_2O_3$) layer. Otherwise, the dielectric layer 310 may be a composite layer including a combination of any of the above oxide layers. A thickness of the dielectric layer 310 may depend on a part of the semiconductor substrate 100 on which it is formed. That is, the dielectric layer 310 may be formed to a different thickness on different parts of the semiconductor substrate 100.

Meanwhile, a surface of the semiconductor substrate 100 may be wet etched before forming the dielectric layer 310. For instance, the surface of the semiconductor substrate 100 is wet etched using an SC-1 etchant so as to round the top corners of the first trench 110, thus improving characteristics of a transistor.

The dielectric layer 310 is deposited on the semiconductor substrate 100 so that it can extend to the bottom and sidewalls of the first trenches 110. Also, the first conductive layer 330 may be formed on the dielectric layer 310 to fill the first trenches 110. The first conductive layer 330 may be used to make transistor gates in a subsequent process, or fill the first trenches 30 so that the stopper 230 can be more planarly formed thereon. Accordingly, the first conductive layer 330 is preferably formed to such a thickness that the first trenches 110 are completely filled with the first conductive layer 330.

After forming the first conductive layer 330, the stopper 230 is formed thereon. The stopper 230 may be used to detect an instant of time when abrasion must be stopped, that is, when second trenches for isolation are formed, an insulating layer is formed to fill the second trenches, and the insulating layer is planarized to be patterned. Therefore, the stopper 230 may be formed of a material with a high selectivity with respect to a silicon oxide that is to be used as the insulating layer. For instance, the stopper 230 may include a nitrogen-based insulating layer, e.g., a silicon nitride layer 235. The silicon nitride layer 235 may be formed to a thickness of about 1500 Å. Further, a silicon oxide layer 231 may be formed to a thickness of about 100 Å and interposed as a buffer layer between the silicon nitride layer 235 and the polycrystalline silicon layer which will be used as the first conductive layer 330.

In the first embodiment, the first conductive layer 330, which fills the first trenches 110, is formed of polycrystalline silicon, but it may be a protective layer that is an opaque layer formed of a different type of material and protects the first trenches 110. The first conductive layer 330 acting as the protective layer may be removed while using a sacrificial layer during a subsequent manufacture process of transistor gates. Otherwise, the first conductive layer 330 may be formed to improve flatness of the stopper 230 so that it can be useful for a subsequent photography process. However, considering that gates must be formed to fill the first trenches 110 in a subsequent transistor manufacture process so as to fabricate a recessed channel, the first conductive layer 330 acting as the protective material is more preferably formed of a conductive material for the gates.

Figure 6:
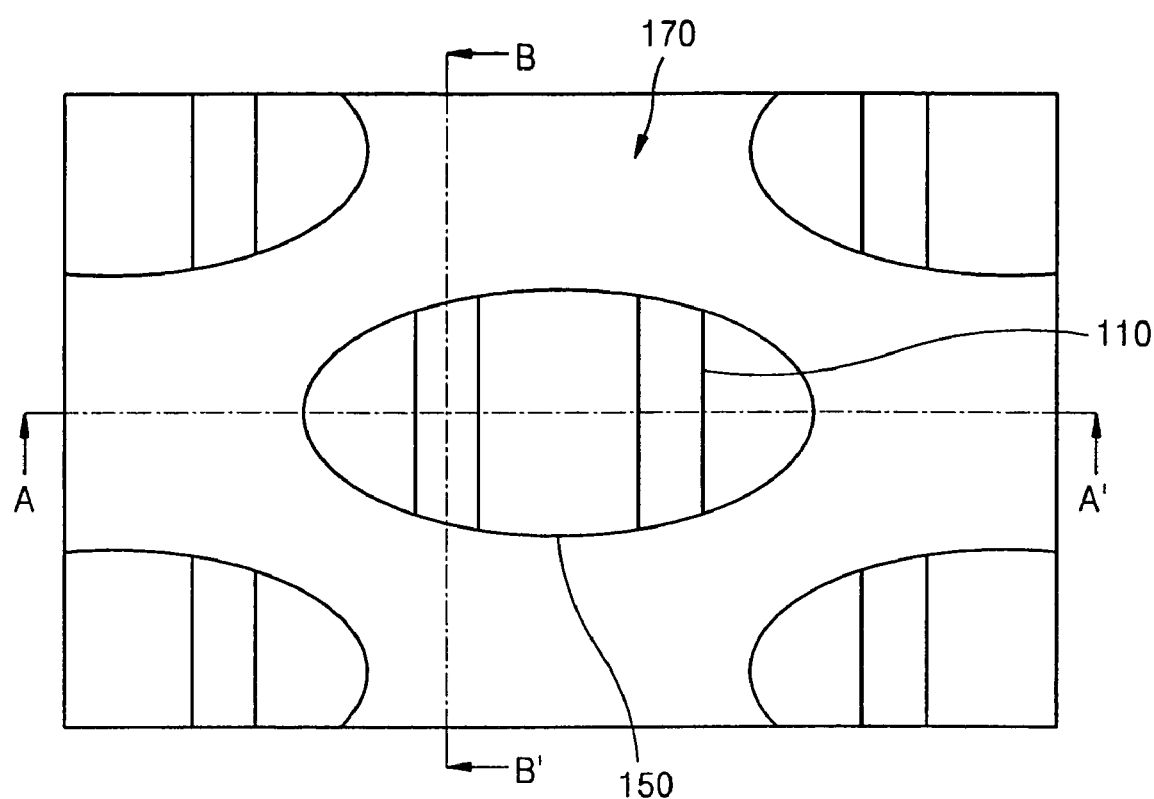

FIG. 6 is a schematic plan view of the semiconductor substrate 100 with an active area 150 defined by an isolation layer 170. FIGS. 7A, 8A, 9A, 10A, 11A, 12A, and 13A are cross-sectional views of the semiconductor substrate 100 of FIG. 6, taken along the line A–A'. FIGS. 7B, 8B, 9B, 10B, 11B, 12B, and 13B are cross-sectional views of the semiconductor substrate 100 of FIG. 6, taken along the line B–B'. The line A–A' of FIG. 6 denotes the long axis of the active area 150 and the line B–B' denotes the short axis perpendicular to the long axis.

Referring to FIG. 6, the isolation layer 170 is formed on the semiconductor substrate 100 to define the active area 150 after the first trenches 100 are formed, as shown in FIG. 2. Thus, the first trenches 110 are formed within the active area 150.

Figure 7A:
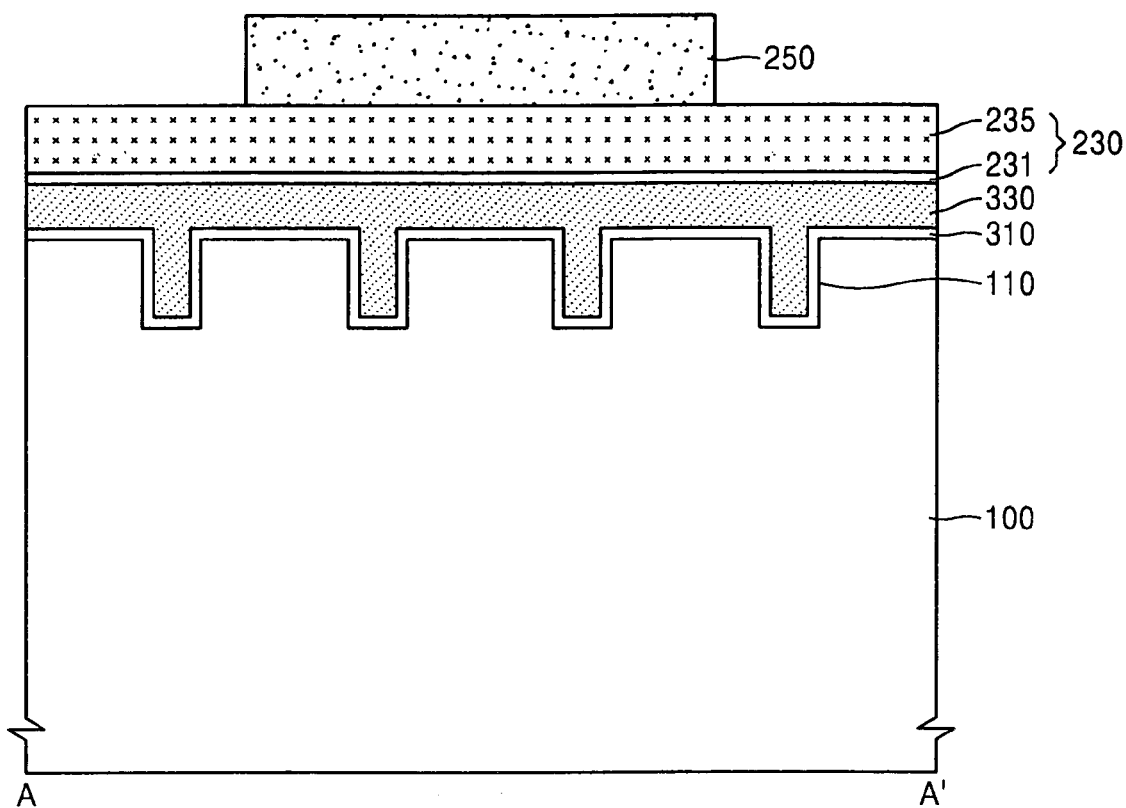
Figure 7B:
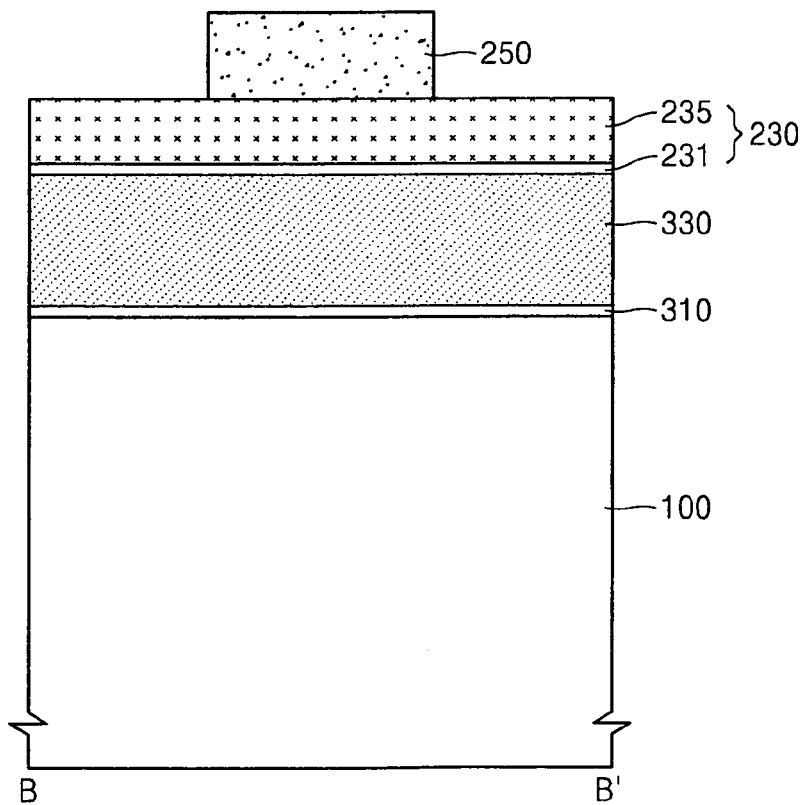

FIGS. 7A and 7B are schematic cross-sectional views illustrating a method of forming a second etch mask layer 250 on the stopper 230. More specifically, the second etch mask layer 250 is formed on the stopper 230, using a material with an etch selectivity with respect to the stopper 230, preferably, a material with an etch selectivity with respect to a silicon material for the semiconductor substrate 100.

The second etch mask layer 250 is preferably used as a photoresist pattern, more preferably, as a hard mask. When used as the hard mask, the second etch mask layer 250 may be formed of silicon oxide. A photoresist pattern may be obtained by forming an anti-reflection layer, e.g., an inorganic or an organic anti-reflection layer, to a thickness of about 1000 Å or less on the silicon oxide layer as the hard mask, applying a photoresist layer onto the anti-reflection layer, and exposing and developing the photoresist layer. Next, as illustrated in FIGS. 7A and 7B, the second etch mask layer 250 may be formed as the hard mask by patterning the silicon oxide layer to act as the hard mask, using the photoresist pattern as an etch mask.

The second etch mask layer 250 is formed to reveal a surface area of the semiconductor substrate 100 on which the isolation layer 170 of FIG. 6 is to be formed.

Figure 8A:
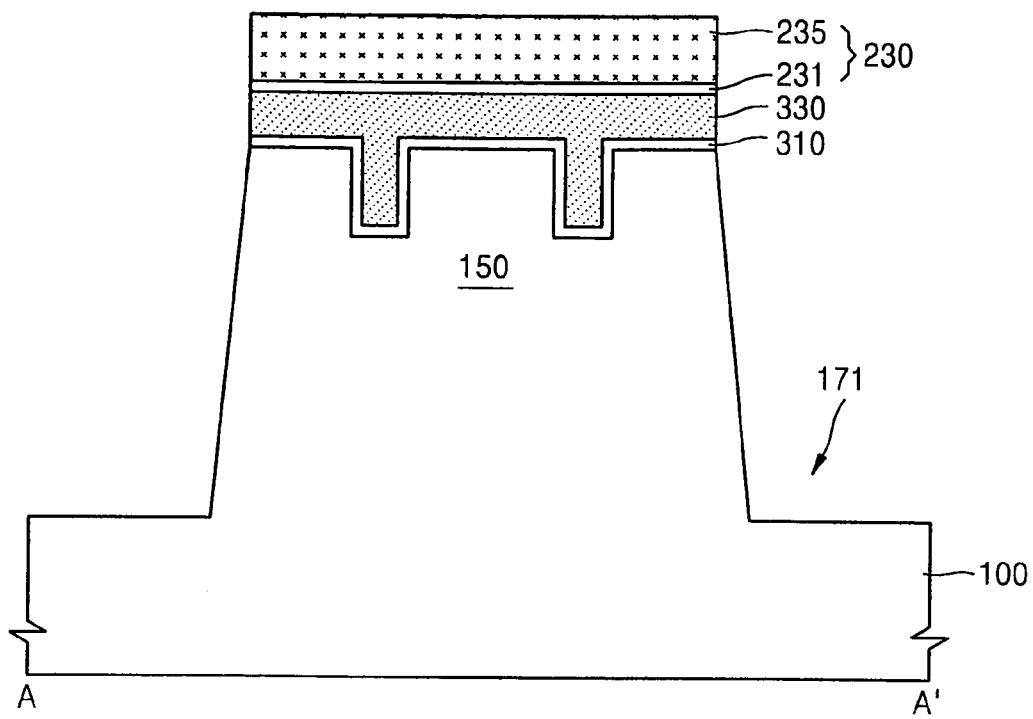
Figure 8B:
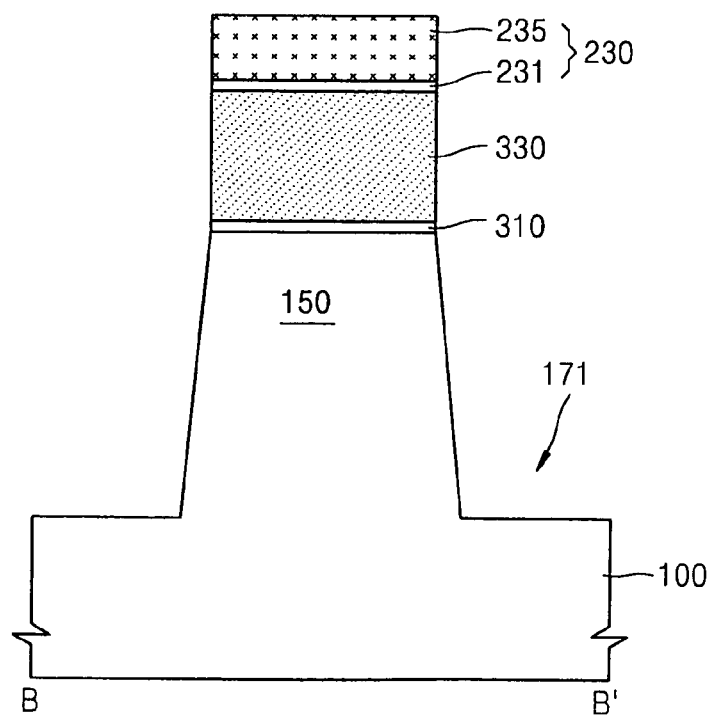

FIGS. 8A and 8B are schematic cross-sectional views illustrating a method of forming second trenches 171 using the second etch mask 250. Referring to FIGS. 8A and 8B, the second trenches 171 are formed by selectively etching the semiconductor substrate 100 using the second etch mask 250. Depths of the second trenches 171, for an isolation layer (not shown) to fill, are deeper than those of the first trenches 110. Sidewalls of the second trenches may be inclined at a predetermined angle. If the second trenches 171 have inclined sidewalls, it is required to increase filling characteristics when depositing the isolation layer to fill the second trenches 71 in a subsequent process.

Figure 9A:
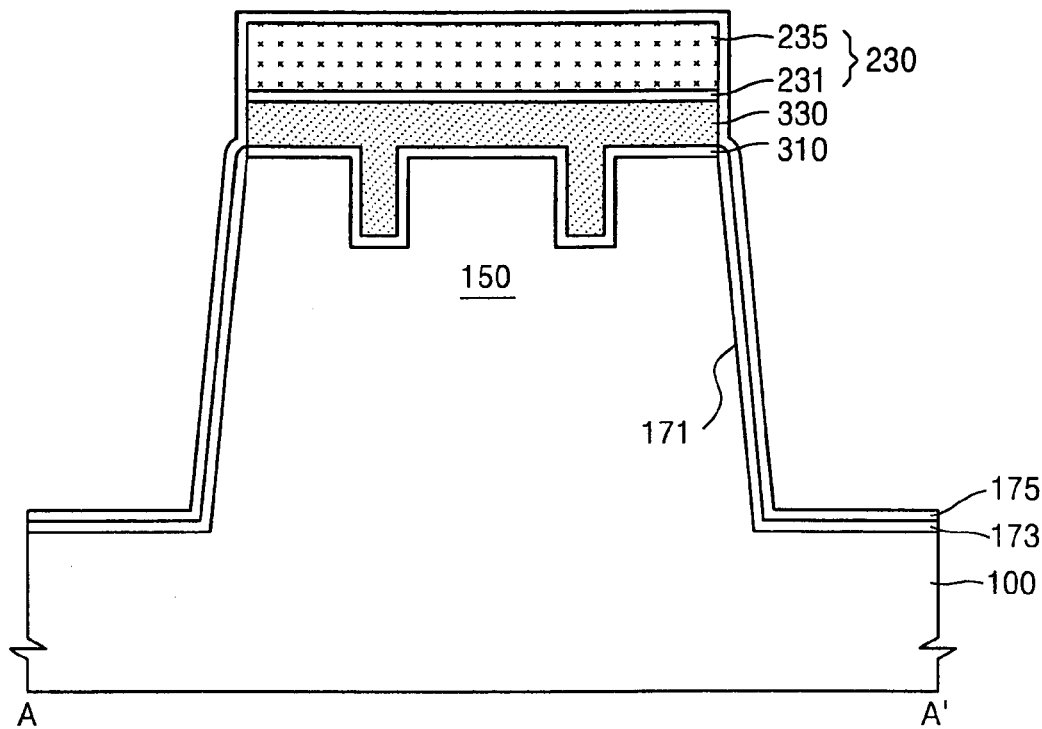
Figure 9B:
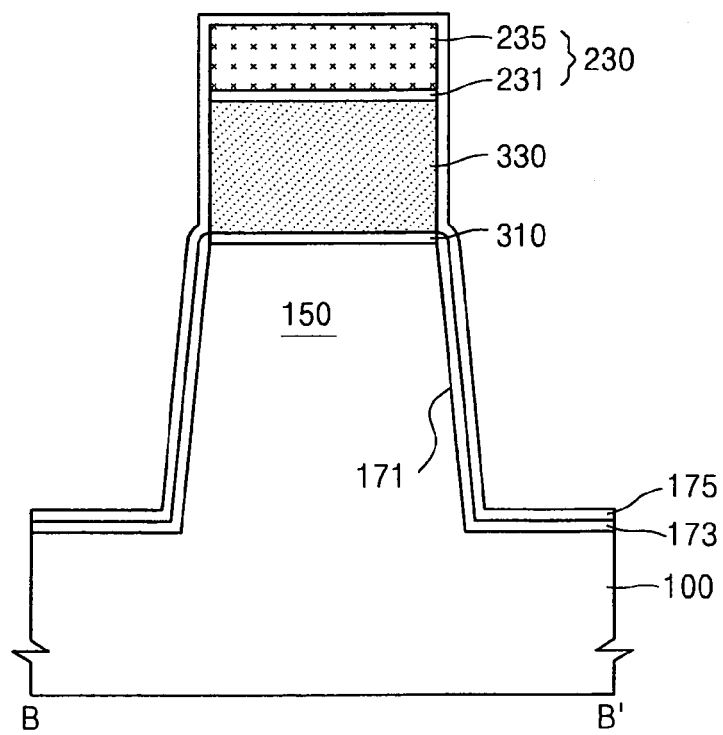

FIGS. 9A and 9B are schematic cross-sectional views illustrating a method of forming buffer layers 173 and 175 along the bottoms and sidewalls of the second trenches 171. Referring to FIGS. 9A and 9B, after forming the second trenches 171, the second etch mask 250 is removed and an isolation process is performed using a general trench isolation process. That is, the buffer layers 173 and 175 are formed along the bottoms and sidewalls of the second trenches 171 before the second trenches are filled with the isolation layer. For instance, the first buffer layer 173 may be a buffer oxide layer formed along the bottoms and sidewalls of the second trenches 171, and the second buffer layer 175 may be a buffer nitride layer formed on the first buffer layer 173.

The buffer oxide layer 173 is obtained by thermally oxidizing the bottoms and sidewalls of the second trenches 171 and forming a silicon oxide layer to a thickness of roughly 200 Å or less or by depositing a silicon oxide layer to a thickness of roughly 200 Å or less. Further, after forming the silicon oxide layer 173, portions of the silicon oxide layer may be etched and a silicon oxide layer may be deposited at portions where the portions of the silicon oxide layer may be etched so that the silicon oxide layer 173 can have dual thicknesses.

After forming the buffer oxide layer 173, the buffer nitride layer 175 is formed as a liner thereon. The buffer oxide layer 175 may be formed to a thickness of about 150 Å.

Figure 10A:
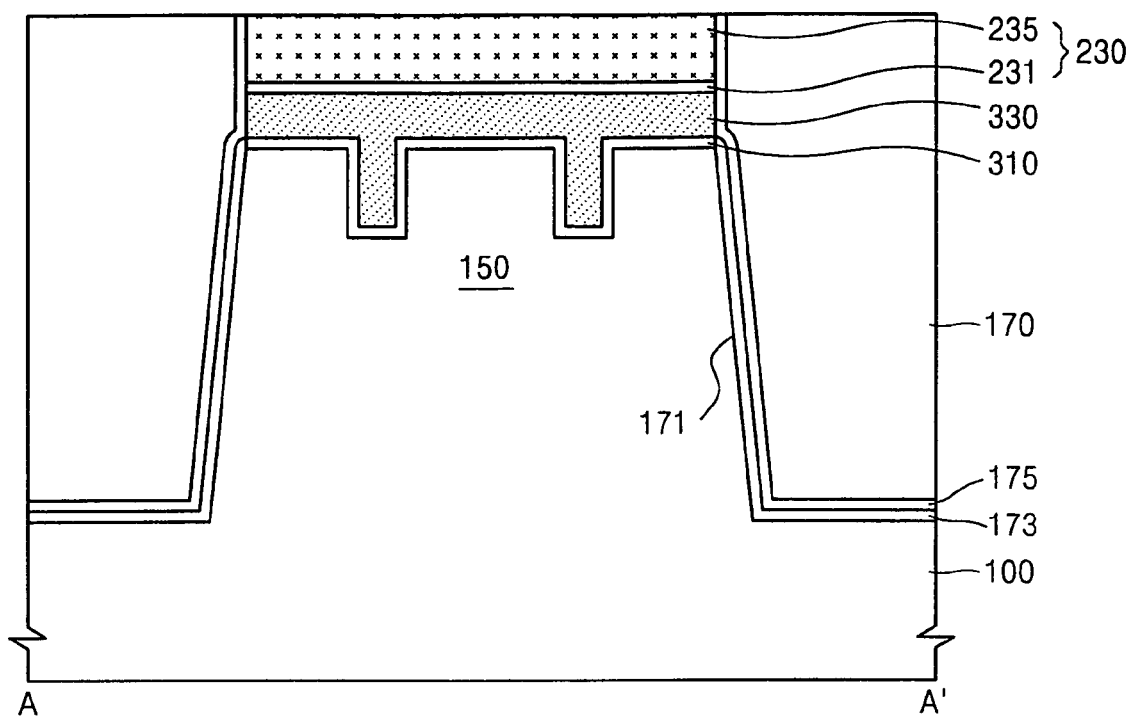
Figure 10B:
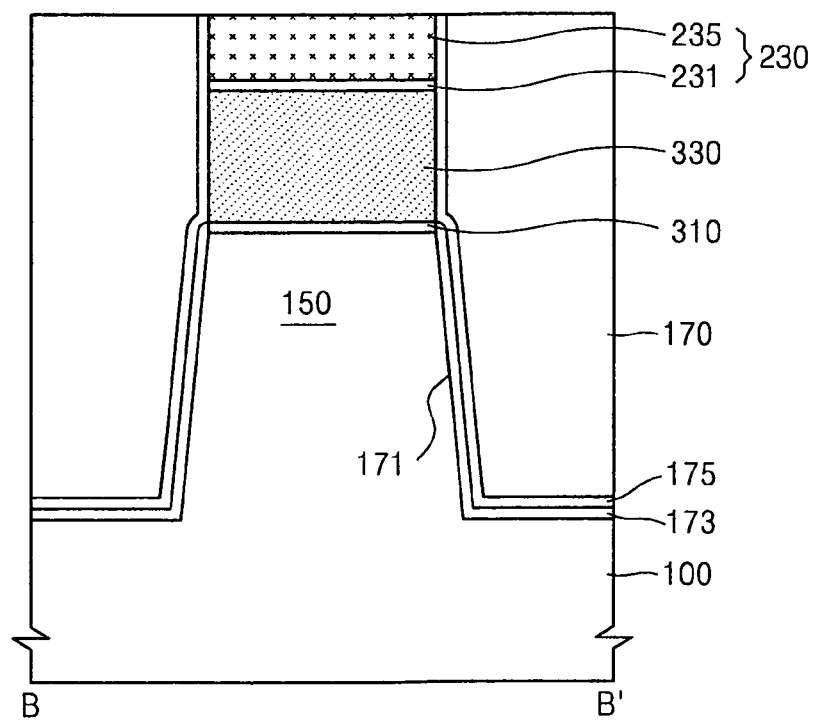

FIGS. 10A and 10B are schematic cross-sectional views illustrating a method of fabricating the isolation layer 170 that fills the second trenches 171. Referring to FIGS. 10A and 10B, the isolation layer 170 is formed of an insulating layer such as a silicon oxide layer. The insulating layer may be deposited to fill the second trenches 171, using a single process or several processes.

Thereafter, the isolation layer 170 is formed by planarizing the silicon oxide layer with respect to the stopper 230 used as a reference point for completing abrasion, for example, using chemical mechanical polishing (CMP). In other words, CMP is performed such that abrasion of the silicon oxide layer ends with respect to the stopper 230 of the silicon nitride layer 235, thereby patterning the silicon oxide layer to obtain the isolation layer 170.

During formation of the isolation layer 170 using CMP, portions of the semiconductor substrate 100, which contact the isolation layer 170 and the first conductive layer 330 which is a protective layer, are protected from CMP and a subsequent process of removing the stopper 230, due to the first conductive layer 330. Accordingly, it is possible to effectively prevent dents from occurring at the portions of the semiconductor substrate 100 that contact the isolation layer 170 and the first conductive layer 330.

Figure 11A:
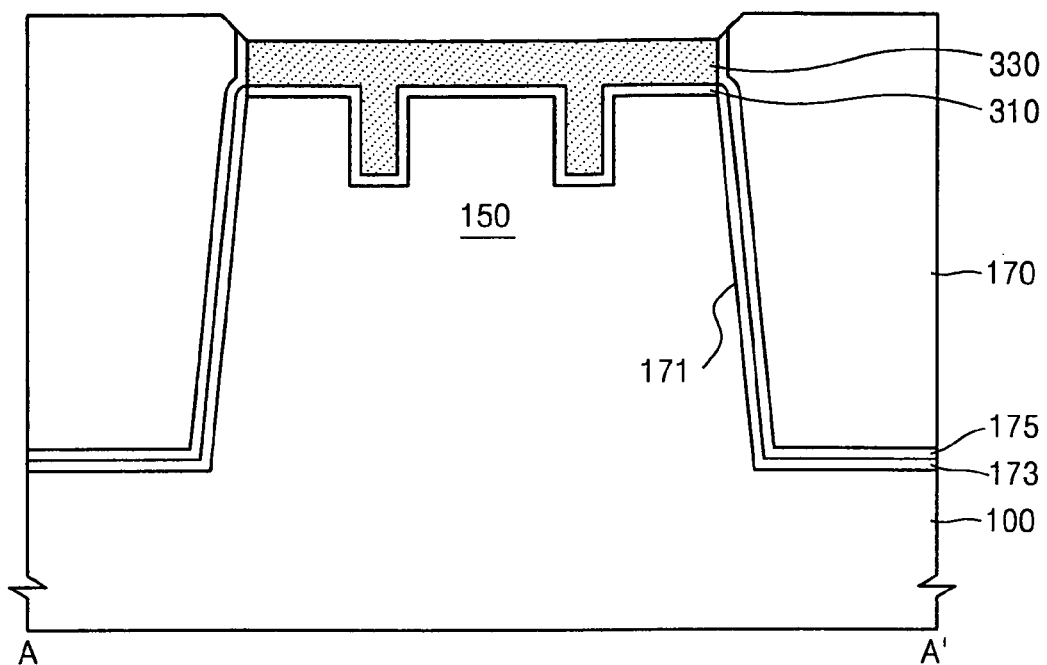
Figure 11B:
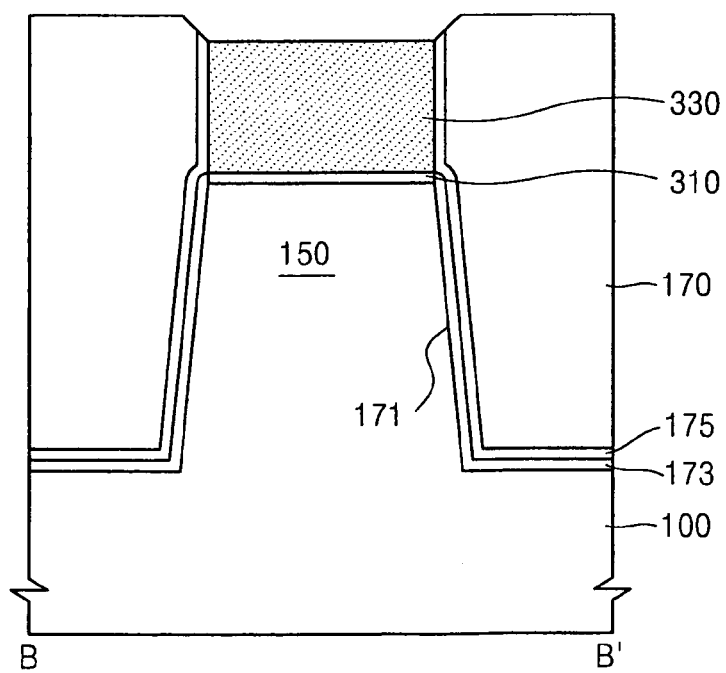

FIGS. 11A and 11B are schematic cross-sectional views illustrating a method of removing the stopper 230. In this method, the silicon nitride layer 235 and the silicon oxide layer 231, which constitute the stopper 230, are removed to expose an upper surface of the first conductive layer 330.

Figure 12A:
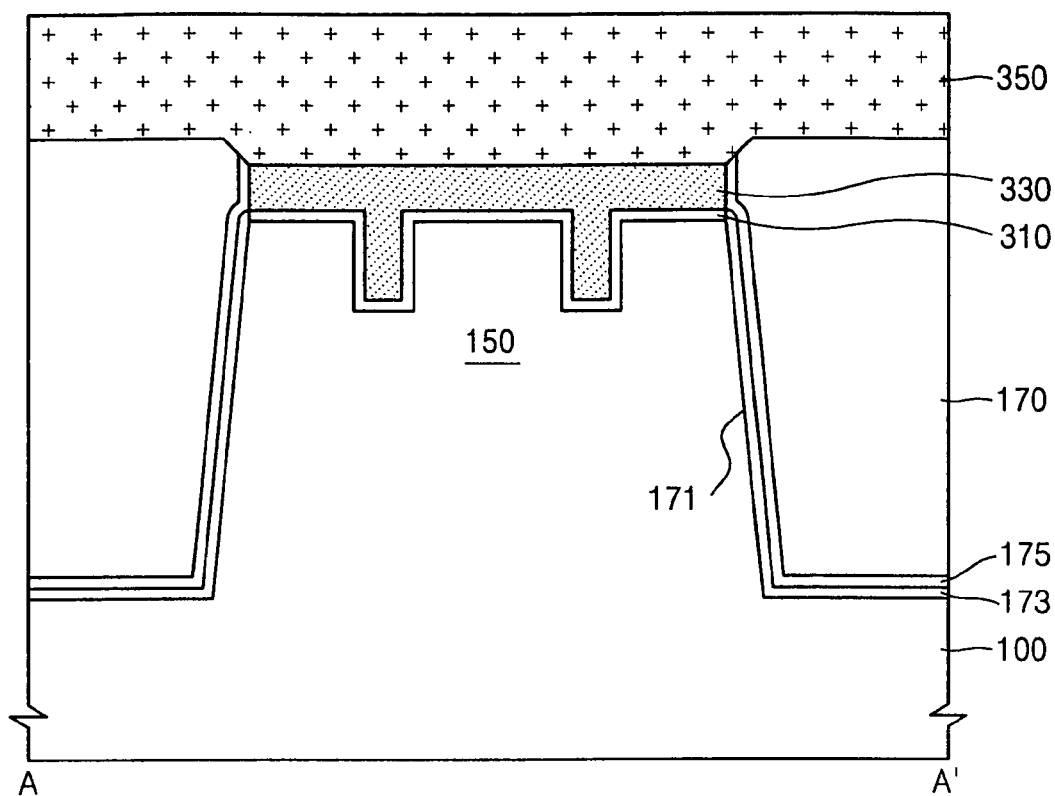
Figure 12B:
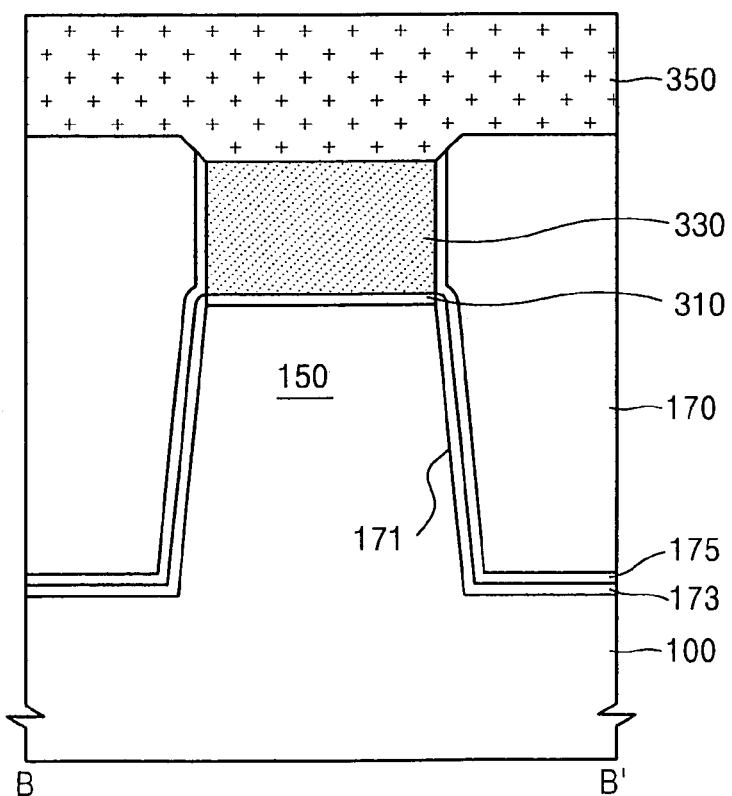

FIGS. 12A and 12B are schematic cross-sectional views illustrating a method of forming a second conductive layer 350 on the first conductive layer 330. In this method, the second conductive layer 350 is deposited on the first conductive layer 330 using a variety of conductive materials such as a metal material. For instance, the second conductive layer 350 may be formed of tungsten.

Figure 13A:
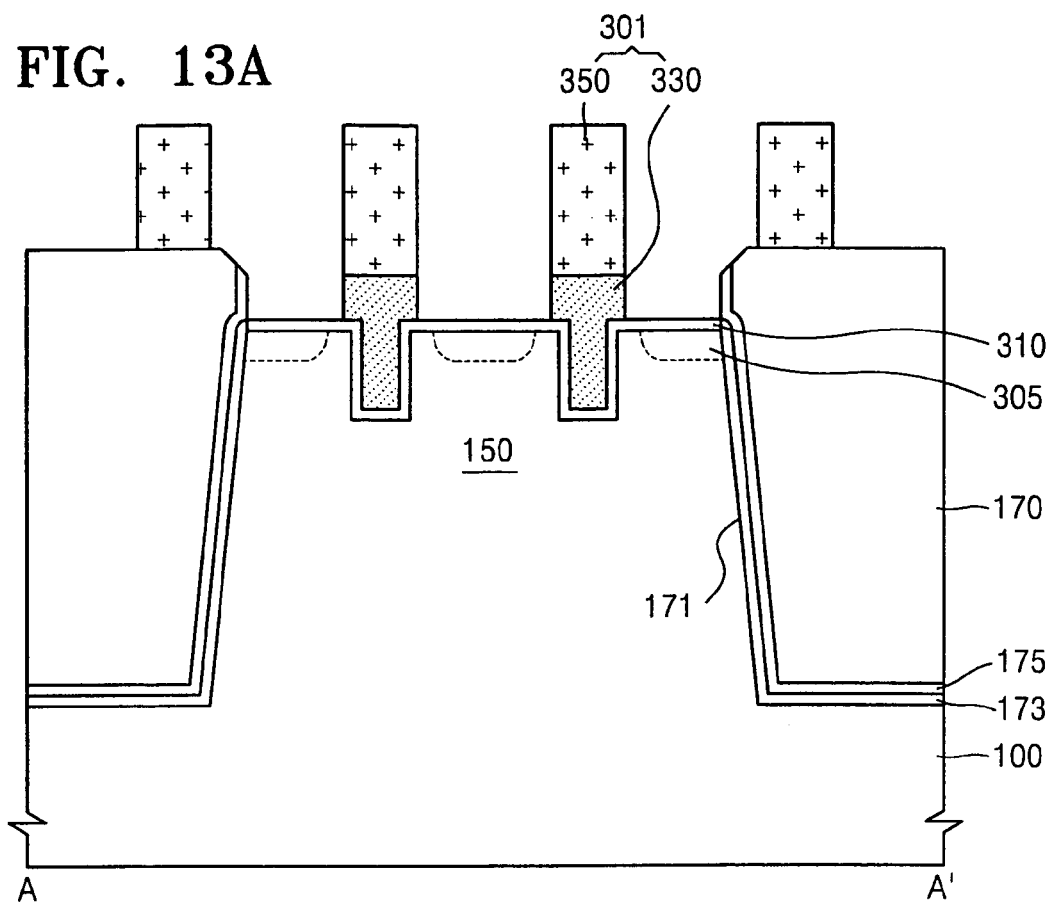
Figure 13B:
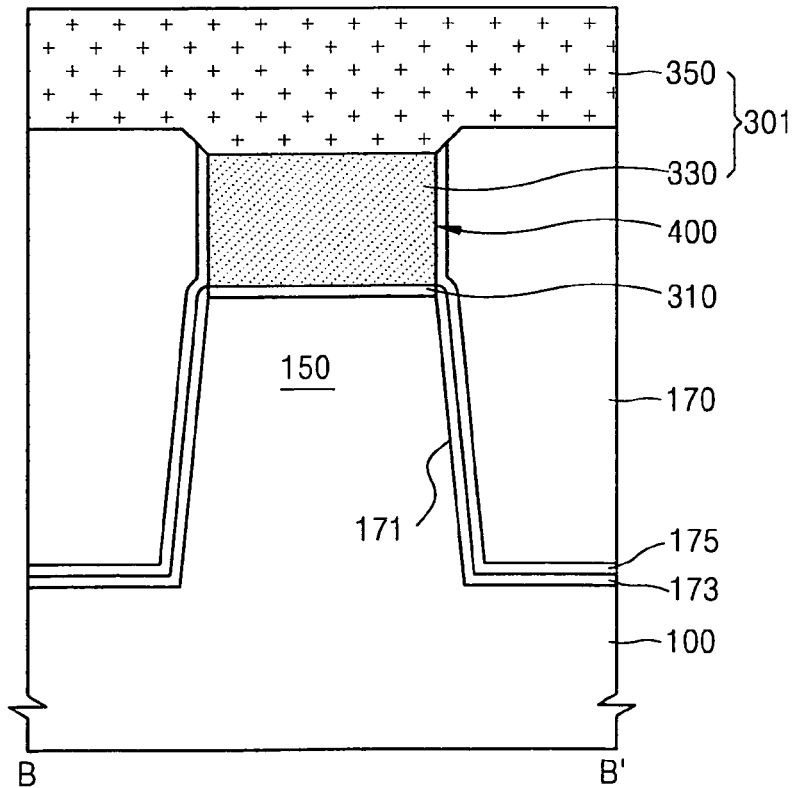

FIGS. 13A and 13B are schematic cross-sectional views illustrating a method of forming gates 301 by patterning the second conductive layer 350 on the first conductive layer 330 and the first conductive layer 330 on the dielectric layer 310. In detail, a hard mask, which is a capping layer formed of silicon nitride, for example, is formed on the second conductive layer 350. Next, the second conductive layer 350 and the first conductive layer 330 are sequentially patterned using the hard mask, thereby obtaining the gates 301.

Next, source and drain regions 305 are formed in an active area of the semiconductor substrate 100 adjacent to the gates 301 using a general transistor manufacture process. Depths of the source and drain regions 305 are shallower than those of the first trenches 110.

As shown in FIGS. 13A and 13B, a transistor according to some embodiments of the invention includes a recessed channel below the gates 301. In detail, the recessed channel is formed under a surface of the semiconductor substrate 100 that also forms the bottoms and sidewalls of the first trenches 110. Accordingly, the recessed channel is longer than a sum of critical dimensions of the gates 301.

Figure 1B:
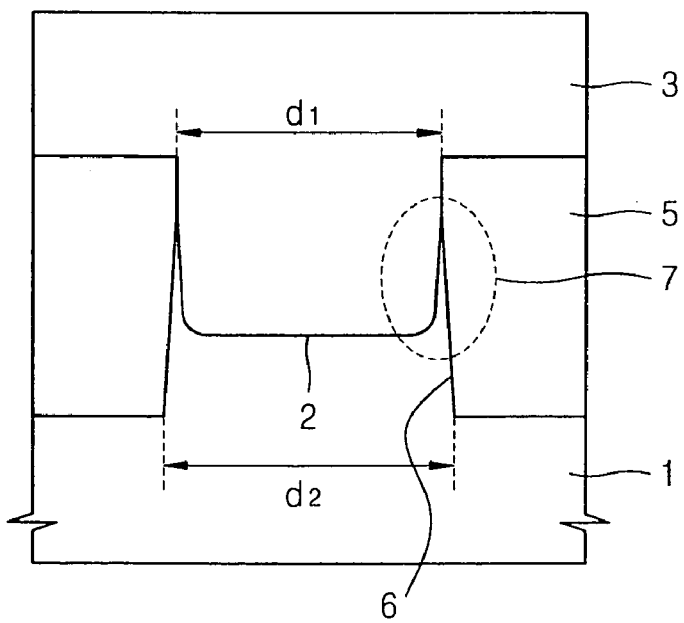

Meanwhile, in the case of a conventional transistor such as that shown in FIG. 1B, generation of the silicon residual substance 7 at an interface between the gate 3 and the isolation layer 5 is unavoidable. However, referring to FIG. 13B, in the transistor according to some embodiments of the invention, a silicon residual substance such as the silicon residual substance 7 does not remain at an interface 400 between the isolation layer 170 and the gate 301.

Accordingly, it is possible to solve problems, e.g. a leakage current or short circuiting between source and drain regions, which are caused by the residual silicon substance.

In the embodiments described above, the first and second conductive layers 330 and 350, which constitute the gate 301, are formed of polycrystalline silicon and metal, respectively. However, materials for the first and second conductive layers 330 and 350 are not limited to the above description and may be replaced with the materials described for the embodiments presented below.

FIGS. 14A, 14B, 15A, and 15B are schematic cross-sectional views illustrating a method of fabricating a transistor with a recessed channel, according to other embodiments of the invention.

The method of fabricating a transistor according to these embodiments is the same as that of fabricating a transistor according to the embodiments described with reference to FIGS. 1 through 11B, except for the process of forming the gates.

Figure 14A:
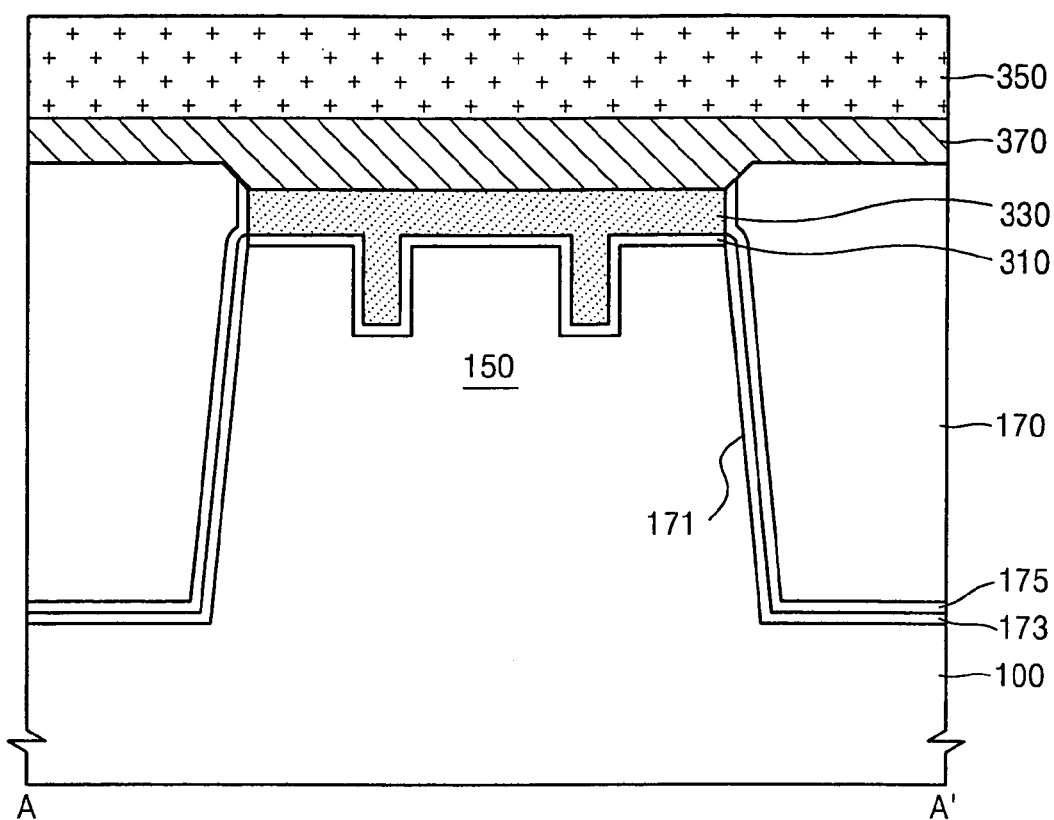
FIGS. 14A through 15B are schematic cross-sectional views illustrating a method of fabricating a transistor with a recessed channel, according to other embodiments of the invention.
Figure 14B:
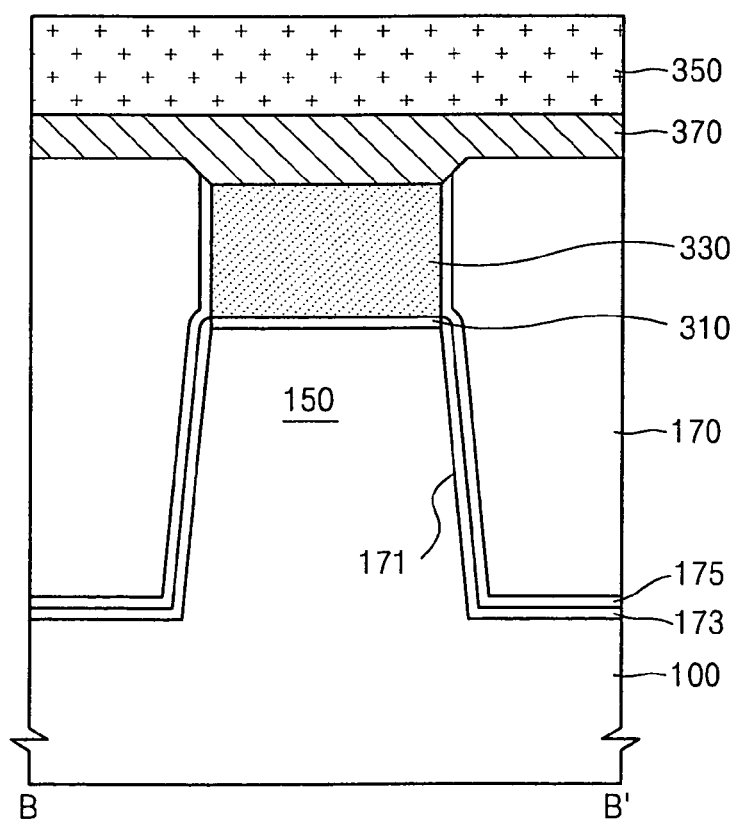

FIGS. 14A and 14B are schematic cross-sectional views illustrating a method of forming a third conductive layer 370 and a second conductive layer 350 on a first conductive layer 330. More specifically, the third conductive layer 370 is formed on the first conductive layer 330 (preferably using polycrystalline silicon). Next, the second conductive layer 350 made of a metal silicide layer is obtained by depositing a metal layer on the third conductive layer 370 and silicidizing the metal layer. For instance, the second conductive layer 350 is a tungsten silicide layer.

Figure 15A:
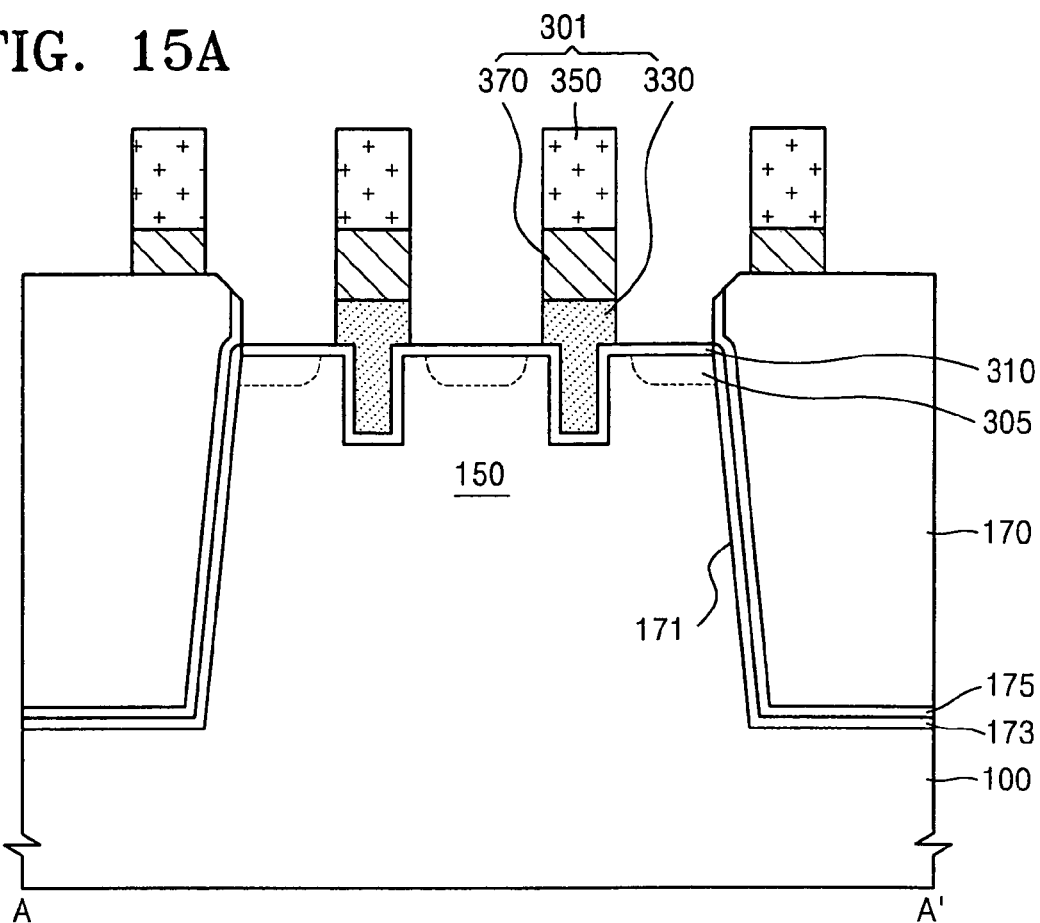
Figure 15B:
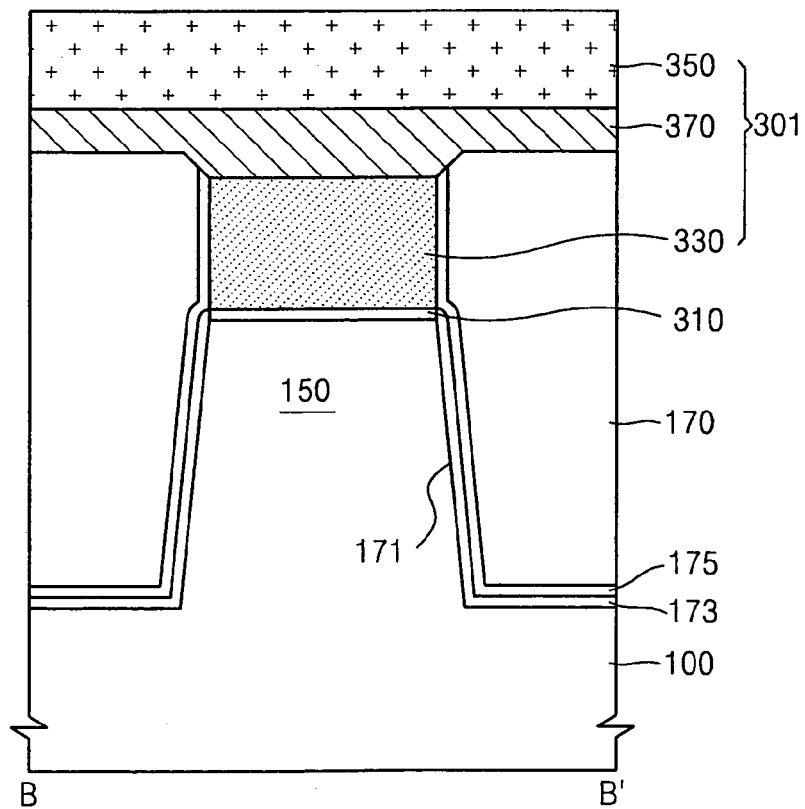

Referring to FIGS. 15A and 15B, the transistor according to other embodiments of the invention is obtained by patterning the first through third conductive layers 330, 350, and 370 to form gates 301 and forming source and drain regions 305.

FIGS. 16A through 18B are schematic cross-sectional views illustrating a method of fabricating a transistor with a recessed channel, according to still other embodiments of the invention.

The method of fabricating a transistor according to these embodiments is also the same as that of fabricating a transistor according to the embodiments described with reference to FIGS. 2 through 11B, except for the process of forming the gates.

Figure 16A:
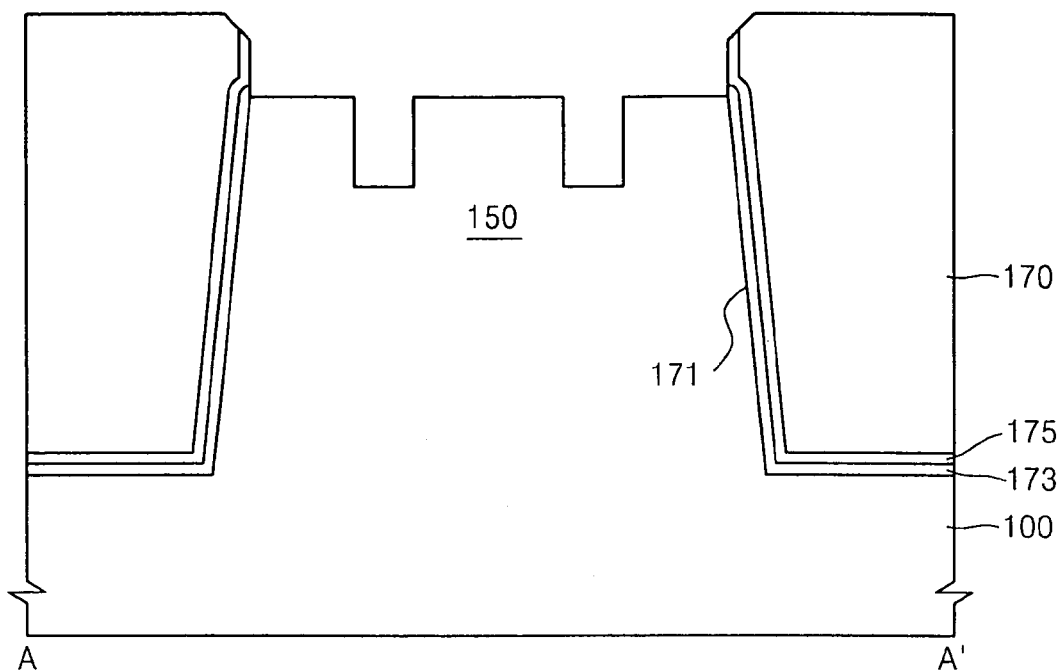
FIGS. 16A through 18B are schematic cross-sectional views illustrating a method of fabricating a transistor with a recessed channel, according to still other embodiments of the invention.
Figure 16B:
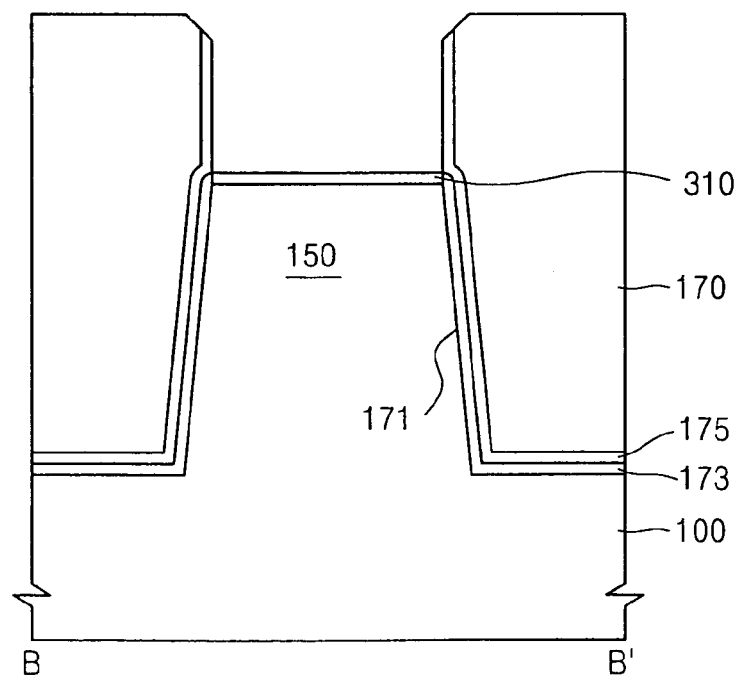

Referring to FIGS. 16A and 16B, a first conductive layer 330 and a dielectric layer 310 of FIGS. 10A and 10B below the first conductor layer 330 are selectively removed after forming an isolation layer 170. The first conductive layer 330, which is a polycrystalline silicon layer, and the dielectric layer 310 act as protective layers. When acting as protective layers, the first conductive layer 330 may be formed of a material other than a conductive material such as polycrystalline silicon and the dielectric layer 310 may be formed of a silicon oxide.

Selective removal of the first conductive layer 330 and the dielectric layer 110 exposes a surface of an active area 150 defined by the bottoms and sidewalls of the first trenches 110.

Figure 17A:
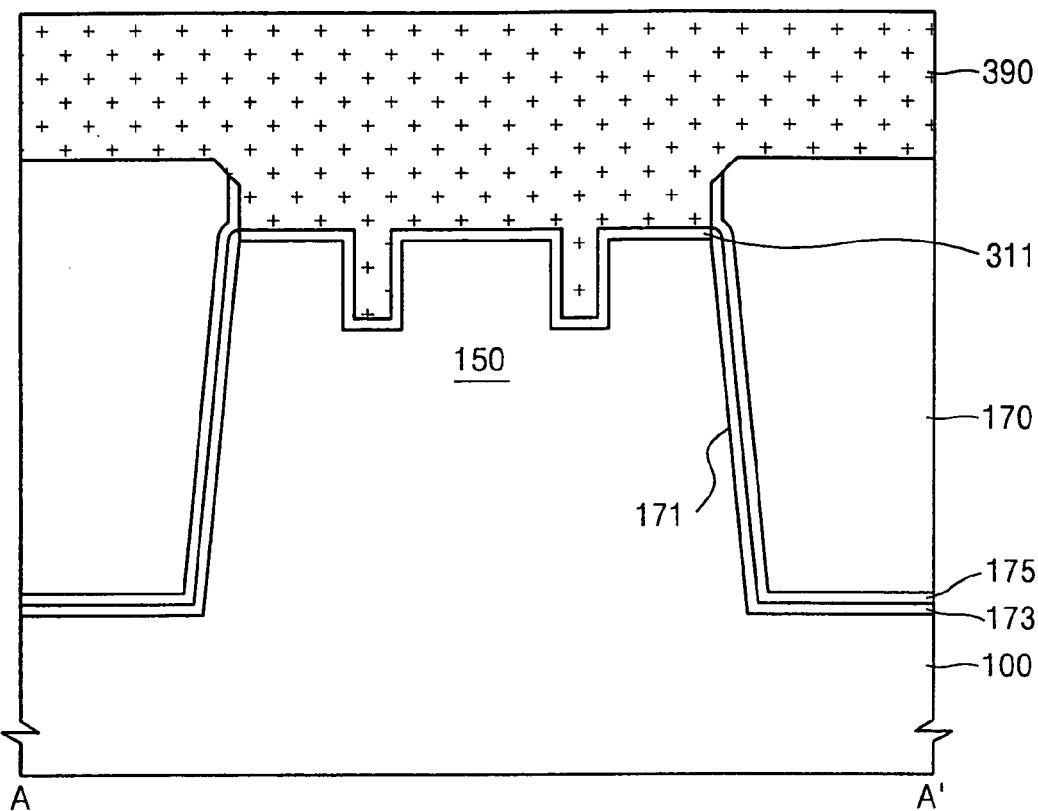
Figure 17B:
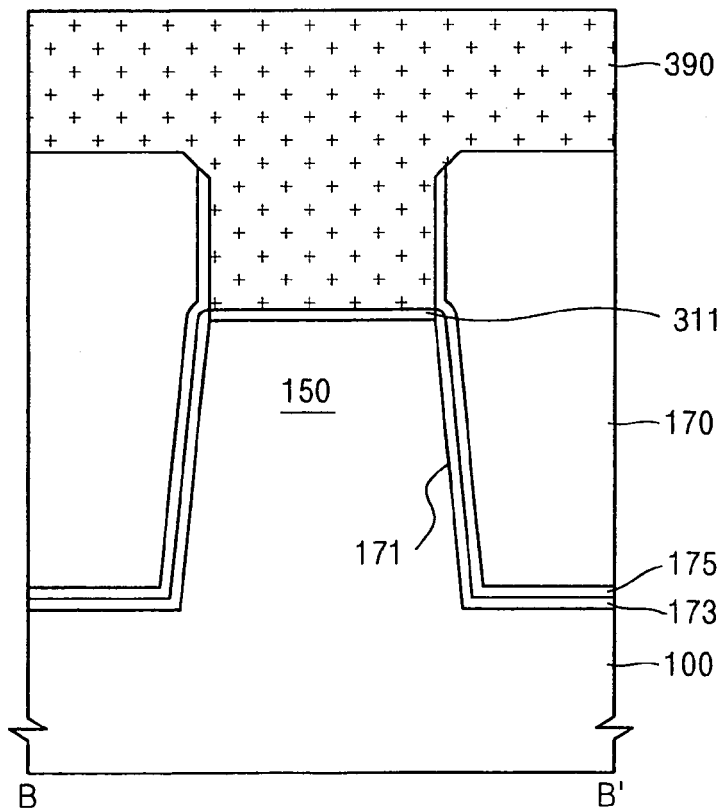

Referring to FIGS. 17A and 17B, a gate dielectric layer 311 is formed on the exposed surface of the active area 150. The gate dielectric layer 311 is thinly formed so that it can be used as a gate oxide layer. For instance, the gate dielectric layer 311 may be formed to a thickness of 200 Å or less, preferably, to 40 Å or less.

When used as a gate oxide layer, the gate dielectric layer 311 may be formed of a silicon oxide ($SiO_2$) using dry thermal oxidation or wet thermal oxidation. If necessary, the gate dielectric layer 311 may be formed of a hafnium oxide ($HfO_2$) or an aluminum oxide ($Al_2O_3$). Otherwise, the gate dielectric layer 311 may be a composite layer that includes the above oxides and be formed to a different thickness on different parts of the semiconductor substrate 100. That is, the gate dielectric layer 311 may have a non-uniform thickness.

Next, a fourth conductive layer 390 is deposited on the gate dielectric layer 311. The fourth conductive layer 390 is formed of a conductive material for gates. For instance, the fourth conductive layer 390 may be a polycrystalline silicon layer, a composite layer including the polycrystalline silicon layer and a metal silicide layer, or a metal layer. Here, the metal silicide layer may be a tungsten silicide layer and the metal layer may be a tungsten layer.

Figure 18A:
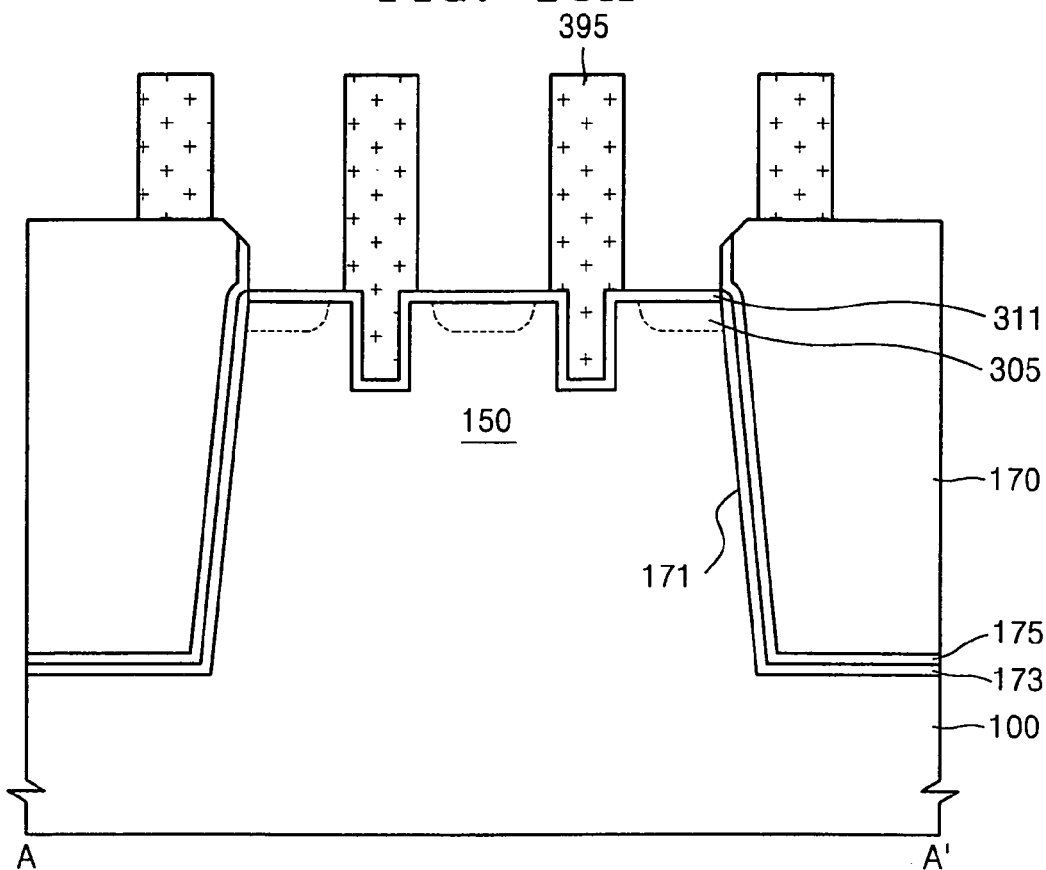
Figure 18B:
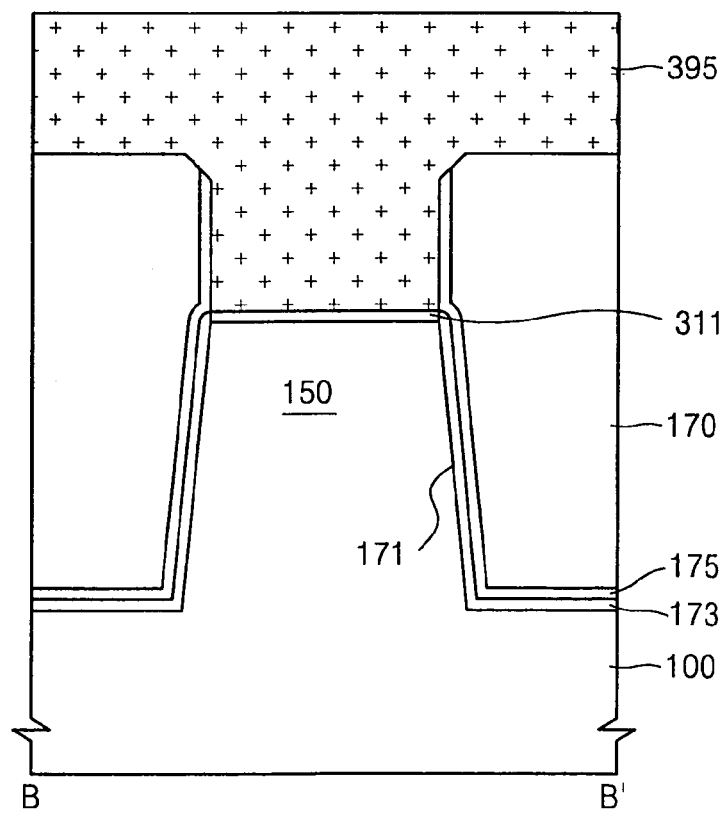

Referring to FIGS. 18A and 18B, gates 395 are formed by patterning the fourth conductive layer 390 to form the gate 395, and then, source and drain regions 305 are formed, thereby obtaining a transistor.

As described above, a transistor with a recessed channel according to embodiments of the invention is capable of preventing short circuiting caused by an extreme reduction in design rule of a semiconductor device.

According to embodiments of the invention, first trenches for the recessed channel are formed before forming second trenches for isolation, thus preventing a material, i.e., a silicon residual substance from remaining between the first trenches and an isolation layer. Therefore, it is possible to prevent the occurrence of a leakage current caused by the silicon residual substance and short circuiting between source and drain regions.

According to embodiments of the invention, since a process of removing the silicon residual substance is not additionally required, problems related to processes such as chemical dry etching, can be avoided.

Furthermore, the second trenches for isolation and an isolation layer for filling the second trenches are formed after forming a conductive layer constituting gates, and thus, a field crowding effect due to the occurrence of dents is not caused. For this reason, for densification, the isolation layer may be thermally processed at a lower temperature after filling the second trenches with the isolation layer, and it is possible to minimize problems caused by thermal budget affected by a large diameter of a semiconductor substrate wafer.

There are many ways to practice the invention. What follows are exemplary, non-limiting descriptions of embodiments of the invention.

According to some embodiments of the invention, a method of fabricating a transistor includes forming trenches for a recessed channel on a semiconductor substrate, depositing an isolation layer on the semiconductor substrate on which the trenches are formed, depositing a gate dielectric layer on the semiconductor substrate so that the gate dielectric layer can be extended to bottoms and sidewalls of the trenches, forming gates to fill the trenches, and forming source and drain regions in the semiconductor substrate adjacent to the gates.

The method may further include forming a protective layer to fill the trenches before deposition of the isolation layer.

The protective layer may be formed of a first conductive layer that partially constitutes the gates and the first conductive layer may comprise a polycrystalline silicon layer. Forming the gates includes forming a second conductive layer on the first conductive layer after the deposition of the isolation layer, and patterning the first and second conductive layers. The gate dielectric layer may be formed prior to forming the first conductive layer.

The protective layer may be selectively removed before forming the gate dielectric layer and may comprise a dielectric layer and a polycrystalline silicon layer.

The method may further include performing wet etching to round top corners of the trenches before forming the gate dielectric layer.

The gate dielectric layer may include one of a silicon oxide layer, a hafnium oxide layer, an aluminum oxide layer, and a composite layer including these layers.

According to other embodiments of the invention, a method of fabricating a transistor includes forming first trenches for a recessed channel on a semiconductor substrate, depositing a gate dielectric layer on the semiconductor substrate on which the first trenches are formed, forming a first conductive layer on the gate dielectric layer to fill the first trenches, forming second trenches for isolation on the semiconductor substrate, depositing an isolation layer to fill the second trenches, depositing a second conductive layer to cover upper portions of the first conductive layer and the isolation layer, forming gates filling the first trenches by patterning the first and second conductive layers, and forming source and drain regions in the semiconductor substrate adjacent to the gates.

The first conductive layer may include a polycrystalline silicon layer. Forming the second conductive layer may include forming a metal layer on the polycrystalline silicon layer, and forming a metal silicide layer by silicidizing the metal layer and the polycrystalline silicon layer. The metal silicide layer may be a tungsten silicide layer.

Forming the isolation layer may include forming an insulating layer to fill the second trenches, and planarizing the insulating layer using chemical mechanical polishing. The method may further include forming a stopper on the first conductive layer to detect a reference point for completing the chemical mechanical polishing. The stopper may include a silicon nitride layer. The stopper may further include a silicon oxide buffer between the silicon nitride layer and the first conductive layer.

The method may further include forming a buffer layer along bottoms and sidewalls of the second trenches prior to forming the isolation layer. The buffer layer may include a silicon oxide layer formed at the bottoms and sidewalls of the second trenches, and a silicon nitride layer as a liner on the silicon oxide layer.

Forming the second conductive layer may include forming a polycrystalline silicon layer on the first conductive layer so that the polycrystalline silicon layer can extend to the isolation layer, and forming a metal layer or a metal silicide layer on the polycrystalline silicon layer.

According to still other embodiments of the invention, a method of fabricating a transistor includes forming first trenches for a recessed channel on a semiconductor substrate; forming a protective layer to fill the first trenches; forming second trenches for isolation on the semiconductor substrate; depositing an isolation layer to fill the second trenches, removing the protective layer; forming a gate dielectric layer on the semiconductor substrate and the first trenches that were exposed by the removal of the protective layer; forming a conductive layer on the gate dielectric layer to fill the first trenches; forming gates filling the first trenches by patterning the conductive layer; and forming source and drain regions in the semiconductor substrate adjacent to the gates.

The protective layer may include a polycrystalline silicon layer to fill the first trenches, and an oxide layer interposed between a surface of the semiconductor substrate and the polycrystalline silicon layer.

The conductive layer may include a composite layer including a polycrystalline silicon layer and a metal silicide layer, or a tungsten layer.

While the invention has been particularly shown and described with reference to preferred embodiments thereof, it will be understood by those skilled in the art that various changes in form and details may be made therein without departing from the spirit and scope of the invention as defined by the appended claims.

We claim:

1. A method of fabricating a transistor, comprising:
   forming trenches for a recessed channel in a semiconductor substrate;
   depositing a gate dielectric layer in the semiconductor substrate so that the gate dielectric layer extends to bottoms and sidewalls of the trenches;
   forming a first conductive layer to fill the trenches;
   thereafter, depositing an isolation layer in the semiconductor substrate in which the trenches are formed;
   forming a second conductive layer on the first conductive layer after the deposition of the isolation layer;
   patterning the first and second conductive layers during a same etching process to form gates that fill the trenches; and
   forming source and drain regions in the semiconductor substrate adjacent to the gates.

2. The method of claim 1, wherein forming the first conductive layer comprises forming a polycrystalline silicon layer.

3. The method of claim 1, wherein depositing the gate dielectric layer comprises depositing the gate dielectric layer prior to forming the first conductive layer.

4. The method of claim 1, further comprising performing wet etching to round top corners of the trenches before forming the gate dielectric layer.

5. The method of claim 1, wherein depositing the gate dielectric layer comprises depositing one selected from the group consisting of a silicon oxide layer, a hafnium oxide layer, an aluminum oxide layer, and a composite layer that includes at least two of the silicon oxide layer, the hafnium oxide layer, and the aluminum oxide layer.

6. A method of fabricating a transistor, comprising:
   forming first trenches for a recessed channel in a semiconductor substrate;
   depositing a gate dielectric layer on the semiconductor substrate in which the first trenches are formed;
   forming a first conductive layer on the gate dielectric layer to fill the first trenches;
   forming second trenches in the semiconductor substrate;
   depositing an isolation layer to fill the second trenches;
   forming a second conductive layer to cover upper portions of the first conductive layer and the isolation layer, wherein forming the second conductive layer includes
      forming a polycrystalline silicon layer on the first conductive layer so that the polycrystalline silicon layer extends to the isolation layer, and
      forming a metal layer or a metal suicide layer on the polycrystalline silicon layer;
   forming gates filling the first trenches by patterning the first and second conductive layers; and
   forming source and drain regions in the semiconductor substrate adjacent to the gates.

7. The method of claim 6, further comprising performing wet etching to round top corners of the first trenches before forming the gate dielectric layer.

8. The method of claim 6, wherein depositing the gate dielectric layer comprises depositing one selected from the group consisting of a silicon oxide layer, a hafnium oxide layer, an aluminum oxide layer, and a composite layer that includes at least two of the silicon oxide layer, the hafnium oxide layer, and the aluminum oxide layer.

9. The method of claim 6, wherein forming the first conductive layer comprises forming a polycrystalline silicon layer.

10. The method of claim 9, wherein forming the second conductive layer comprises:
    forming a metal layer on the polycrystalline silicon layer; and
    forming a metal suicide layer by silicidizing the metal layer and the polycrystalline silicon layer.

11. The method of claim 10, wherein forming the metal silicide layer comprises forming a tungsten silicide layer.

12. The method of claim 6, wherein forming the isolation layer comprises:
    forming an insulating layer to fill the second trenches; and
    planarizing the insulating layer using chemical mechanical polishing.

13. The method of claim 12, further comprising forming a stopper on the first conductive layer to detect a reference point for completing the chemical mechanical polishing.

14. The method of claim 13, wherein forming the stopper comprises forming a silicon nitride layer.

15. The method of claim 14, wherein forming the stopper further comprises forming a silicon oxide buffer between the silicon nitride layer and the first conductive layer.

16. The method of claim 6, further comprising forming a buffer layer along bottoms and sidewalls of the second trenches prior to forming the isolation layer.

17. The method of claim 16, wherein forming the buffer layer comprises:
    forming a silicon oxide layer at the bottoms and sidewalls of the second trenches; and
    forming a silicon nitride layer as a liner on the silicon oxide layer.

18. The method of claim 2, wherein forming the second conductive layer comprises:
    forming a metal layer on the polycrystalline silicon layer; and
    forming a metal silicide layer by silicidizing the metal layer and the polycrystalline silicon layer.

* * * * *

UNITED STATES PATENT AND TRADEMARK OFFICE
CERTIFICATE OF CORRECTION

PATENT NO. : 7,125,774 B2  Page 1 of 1
APPLICATION NO. : 10/937532
DATED : October 24, 2006
INVENTOR(S) : Min Kim et al.

It is certified that error appears in the above-identified patent and that said Letters Patent is hereby corrected as shown below:

Column 1, line 65, the word "comers" should read -- corners --;
Column 4, line 47, the word "comers" should read -- corners --;
Column 9, line 39, the word "comers" should read -- corners --;
Column 9, line 42, the word "haftium" should read -- hafnium --;
Column 11, line 25, the word "suicide" should read -- silicide --;
Column 12, line 6, the word "suicide" should read -- silicide --.

Signed and Sealed this

Second Day of September, 2008

JON W. DUDAS
*Director of the United States Patent and Trademark Office*